United States Patent
Osman

(10) Patent No.: US 9,461,565 B2
(45) Date of Patent: Oct. 4, 2016

(54) SYSTEMS, APPARATUS, AND METHODS FOR SOFT STARTING LARGE AC MOTORS WITH A VARIABLE FREQUENCY DRIVE

(71) Applicant: Siemens Aktiengesellschaft, München (DE)

(72) Inventor: Richard H. Osman, Pittsburgh, PA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 32 days.

(21) Appl. No.: 13/915,815

(22) Filed: Jun. 12, 2013

(65) Prior Publication Data

US 2013/0334998 A1   Dec. 19, 2013

Related U.S. Application Data

(60) Provisional application No. 61/659,133, filed on Jun. 13, 2012.

(51) Int. Cl.
| | |
|---|---|
| H02P 1/30 | (2006.01) |
| H02P 1/52 | (2006.01) |
| H02P 3/00 | (2006.01) |
| H02P 7/06 | (2006.01) |
| H02P 27/04 | (2016.01) |
| H02P 1/02 | (2006.01) |
| H02P 25/18 | (2006.01) |
| G01R 19/00 | (2006.01) |

(52) U.S. Cl.
CPC .............. *H02P 1/028* (2013.01); *H02P 1/30* (2013.01); *H02P 1/52* (2013.01); *H02P 25/18* (2013.01); *G01R 19/0092* (2013.01); *H02P 27/04* (2013.01)

(58) Field of Classification Search
CPC ... H02P 27/04; G01R 19/0092; G01R 31/42; H02M 5/458; H02M 7/003
USPC ................................ 318/503, 494; 361/23, 1
See application file for complete search history.

(56) References Cited

U.S. PATENT DOCUMENTS

| | | | |
|---|---|---|---|
| 6,339,309 B1* | 1/2002 | Bixel et al. ................... | 318/727 |
| 2008/0174257 A1* | 7/2008 | Schnetzka et al. .......... | 318/434 |
| 2008/0265828 A1* | 10/2008 | Ganev et al. ................ | 318/777 |
| 2009/0284999 A1* | 11/2009 | Gibbs et al. ................. | 363/65 |
| 2012/0187886 A1* | 7/2012 | Mack ...................... | H02P 27/06 318/503 |
| 2012/0206083 A1* | 8/2012 | Higashikawa .......... | H02P 25/20 318/808 |

* cited by examiner

*Primary Examiner* — Shawki S Ismail
*Assistant Examiner* — Bradley Brown

(57) ABSTRACT

A system for soft starting a large AC motor may include a variable frequency drive (VFD) having a much lower voltage rating than the rated voltage of the AC motor. The VFD's voltage rating may be in a range of about 33% to about 67% of the AC motor's rated voltage. The AC motor may be coupled to a utility power source via conventional connections to leads of the AC motor's windings. The VFD may be connected to the AC motor via tapped connections within the windings of the AC motor such that the tap voltages are much less than the AC motor's rated voltage. A less expensive VFD may therefore be used to soft start the AC motor instead of a VFD having the same rated voltage as the AC motor. Methods of starting large AC motors with a VFD are also provided, as are other aspects.

16 Claims, 3 Drawing Sheets

SYSTEMS, APPARATUS, AND METHODS FOR SOFT STARTING LARGE AC MOTORS WITH A VARIABLE FREQUENCY DRIVE

RELATED APPLICATION

This claims priority to U.S. Provisional Patent Application No. 61/659,133, filed on Jun. 13, 2012, entitled "METHOD FOR SOFT STARTING OF LARGE MOTORS," the disclosure of which is hereby incorporated by reference in its entirety herein.

FIELD

The invention relates generally to AC (alternating current) motors, and more particularly to starting large AC motors.

BACKGROUND

One or more problems may result when starting large (e.g., "medium voltage") AC motors via direct connection to a utility power source. For example, a large AC motor may draw four to six times its rated current (known as inrush current) at a low power factor upon startup. This may cause significant transient voltage drops in the network of the utility power source, which may adversely affect other equipment and systems connected thereto. Also, the AC motor may undergo severe thermal and mechanical stress during a direct on-line start, which may shorten the life of the motor and/or limit the number of starts in a given period. Furthermore, during acceleration of a large AC motor, large torque pulsations may occur that can excite system torsional resonances that have been known on at least one occasion to cause a broken motor shaft. To overcome the aforementioned problems, large AC motors may be "soft started" with a variable frequency drive (VFD). A VFD may controllably increase the magnitude and frequency of voltage applied to an AC motor during start-up. The voltage magnitude and frequency may start at very low values and may then increase to the rated voltage of the AC motor and to the frequency of the utility power source (e.g., 60 hertz) as the AC motor reaches its rated speed. However, VFDs used to start large AC motors are typically very large and very expensive, often exceeding the cost of the AC motor. Therefore, a need exists to provide less costly systems, apparatus, and methods for starting large AC motors.

SUMMARY

According to one aspect, a system for starting an alternating current (AC) motor is provided. The system includes a variable frequency drive configured to be coupled to a utility power source and to provide an output voltage having a variable frequency and a variable peak magnitude; an AC motor having a rated voltage, at least one lead winding connection, and a least one tapped winding connection; a first contactor coupled in series between the variable frequency drive and the at least one tapped winding connection, the first contactor controlled by the variable frequency drive to selectively connect and disconnect the output voltage to and from the at least one tapped winding connection; and a second contactor coupled in series to the at least one lead winding connection, the second contactor controlled by the variable frequency drive to selectively connect and disconnect power received from the utility power source to and from the at least one lead winding connection; wherein the output voltage has a maximum peak magnitude less than the rated voltage of the AC motor.

According to another aspect, an alternating current (AC) motor is provided. The AC motor includes a plurality of lead winding connections configured to receive a rated voltage of the AC motor from a utility power source, and a plurality of tapped winding connections configured to receive a maximum voltage less than the rated voltage, wherein the number of tapped winding connections equals the number of lead winding connections.

According to yet another aspect, a method of starting an alternating current (AC) motor is provided. The method includes providing an AC motor having a rated voltage, a plurality of lead winding connections, and a plurality of tapped winding connections, the plurality of lead winding connections configured to receive power from a utility power source; providing a variable frequency drive having a voltage rating less than the rated voltage of the AC motor; coupling a first contactor in series between the variable frequency drive and the plurality of tapped winding connections, the first contactor controlled by the variable frequency drive to selectively connect and disconnect an output voltage of the variable frequency drive to and from the plurality of tapped winding connections; and coupling a second contactor in series to the plurality of lead winding connections, the second contactor controlled by the variable frequency drive to selectively connect and disconnect utility power received from the utility power source to and from the plurality of lead winding connections.

Still other aspects, features, and advantages of the invention may be readily apparent from the following detailed description wherein a number of example embodiments and implementations are described and illustrated, including the best mode contemplated for carrying out the invention. The invention may also be capable of other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives falling within the scope of the invention.

BRIEF DESCRIPTION OF DRAWINGS

The drawings, described below, are for illustrative purposes only and are not necessarily drawn to scale. The drawings are not intended to limit the scope of the invention in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

Large AC (alternating current) motors may include medium voltage AC motors, which may have a rated voltage ranging from about 600 V (volts) AC to about 15,000 V (or 15 kV) AC. The "rated voltage" of a motor is a standardized term established by the National Electrical Manufacturers Association (NEMA) that generally refers to a motor's operating voltage usually +/−10%. Large AC motors may also include high voltage AC motors and, in some cases, other types of AC motors that may have a rated voltage below the above voltage range for medium voltage AC motors.

The aforementioned problems of starting a large AC motor may be overcome by "soft starting" the AC motor with a variable frequency drive (VFD). A VFD may initially apply to an AC motor at startup a low or near-zero voltage having a low or near-zero frequency. As the AC motor speed reaches its rated speed, the VFD may controllably increase both the voltage magnitude and frequency to the AC motor's rated voltage and a utility power source's frequency. At about that point, power supplied to the AC motor may be switched from the VFD directly to the utility power source. However, using a VFD to controllably increase the voltage magnitude up to the AC motor's rated voltage, as may be known, may require a very large and expensive VFD having a voltage rating the same or substantially the same as the rated voltage of the AC motor.

In one aspect, a VFD having a voltage rating much lower than the rated voltage of an AC motor may be used to soft start the AC motor. Instead of connecting the VFD to an AC motor's lead winding connections, as may be done conventionally, the VFD may be connected to tapped winding connections additionally provided by the AC motor. By connecting the VFD to the tapped winding connections, and by temporarily reducing the AC motor's load (e.g. compressors, pumps, and/or fans) during startup, a smaller and less expensive VFD having a voltage rating much less than the AC motor's rated voltage may be used to smoothly start the AC motor. In other aspects, methods of starting AC motors are provided, as will be explained in greater detail below in connection with FIGS. 1-4.

Figure 1:
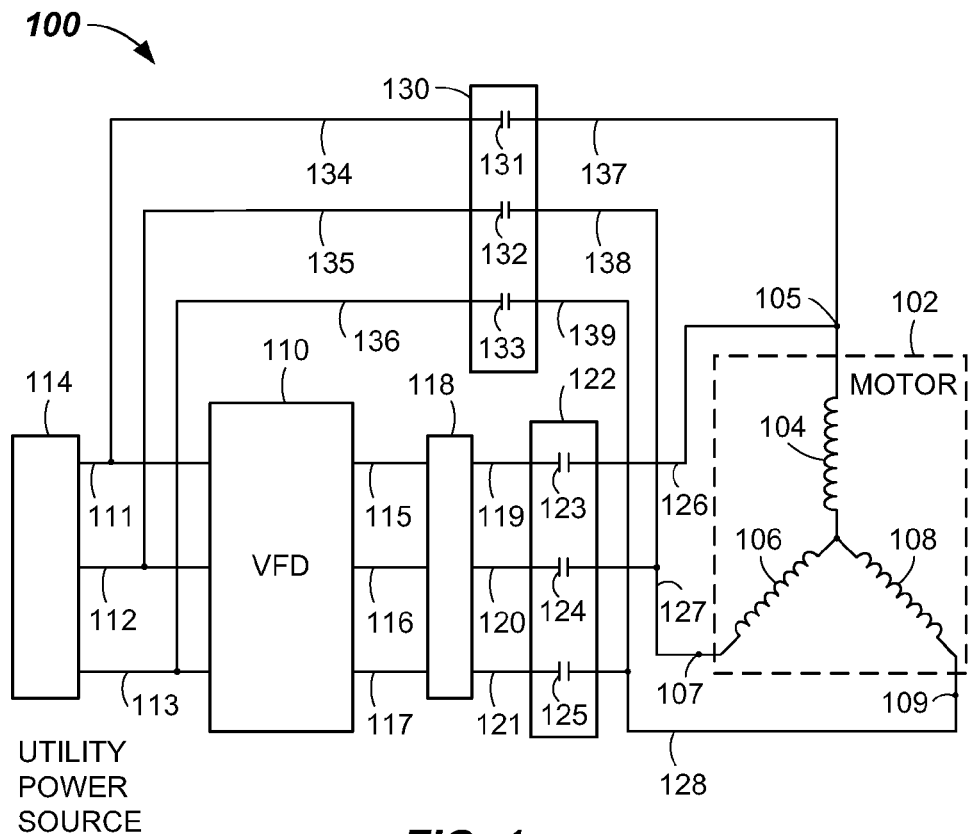
FIG. 1 illustrates a schematic diagram of a system for starting large AC (alternating current) motors with a variable frequency drive (VFD) according to the prior art.

FIG. 1 illustrates an example of a known system 100 for starting a large AC motor 102 in accordance with the prior art. AC motor 102 may be a 3-phase medium voltage AC motor having a first winding 104, a second winding 106, and a third winding 108 arranged in a star or Y-connection configuration. First winding 104 may have a first lead winding connection 105. Second winding 106 may have a second lead winding connection 107, and third winding 108 may have a third lead winding connection 109. AC motor 102 may be coupled to a load (not shown), which may be, e.g., one or more compressors, pumps, fans, and/or other suitable equipment.

System 100 may also include a variable frequency drive (VFD) 110 and a reactor 118. VFD 110 may have a voltage rating that is the same or substantially the same as the rated voltage of AC motor 102. VFD 110 may be coupled to receive 3-phase power via conductors 111, 112, and 113 (one conductor per phase) from a utility power source 114. VFD 110 may be configured to output 3-phase power having a variable peak voltage magnitude and a variable frequency via conductors 115, 116, and 117 (one conductor per phase). Reactor 118, which may be a 3-phase reactor, may be coupled in series to VFD 110 via conductors 115, 116, and 117. Reactor 118 may provide inductance (which may add impedance) to the 3-phase output of VFD 110.

System 100 may further include a first contactor 122 and a second contactor 130. First contactor 122 may include a first control switch 123, a second control switch 124, and a third control switch 125 each coupled in series to reactor 118 via respective conductors 119, 120, and 121. First control switch 123 may also be coupled in series to first lead winding connection 105 via conductor 126. Second control switch 124 may also be coupled in series to second lead winding connection 107 via conductor 127, and third control switch 125 may also be coupled in series to third lead winding connection 109 via conductor 128.

Second contactor 130 may include a first control switch 131, a second control switch 132, and a third control switch 133 each coupled in series to utility power source 114 via respective conductors 134, 135, and 136 (one conductor per phase). First control switch 131 may be coupled in series to first lead winding connection 105 via conductor 137. Second control switch 132 may be coupled in series to second lead winding connection 107 via conductor 138, and third control switch 133 may be coupled in series to third lead winding connection 109 via conductor 139.

First contactor 122 and second contactor 130 may be controlled by VFD 110. That is, VFD 110 may control the opening and closing of first, second, and third control switches 123, 124, and 125 to connect and disconnect the output voltage of VFD 110 to and from AC motor 102. Similarly, VFD 110 may control the opening and closing of first, second, and third control switches 131, 132, and 133 to connect and disconnect utility power of utility power source 114 to and from AC motor 102.

Each of conductors 111-113, 115-117, 119-121, 126-128, 134-136, and 137-139 may be an electrical wire or cable of suitable gauge and/or size.

To start up AC motor 102, system 100 may operate as follows: Upon or prior to startup, VFD 110 may cause first contactor 122 to connect the variable voltage output of VFD 110 (via reactor 118) to AC motor 102, while VFD 110 may cause second contactor 130 to disconnect utility power (received from utility power source 114) from AC motor 102. That is, first, second, and third control switches 123, 124, and 125 of first contactor 122 may be closed by VFD 110, while first, second, and third control switches 131, 132, and 133 of second contactor 130 may be opened by VFD 110. VFD 110, which may receive 3-phase power from utility power source 114, may then initially provide a low or near-zero voltage having a low or near-zero frequency to each of first, second, and third lead winding connections 105, 107, and 109 (separated by appropriate phase angles) via respective conductors 126, 127, and 128. The application of voltage to AC motor 102 may cause the rotor (not shown) of AC motor 102 to begin rotating (in other words, the speed of AC motor 102 begins to increase from zero). The speed of AC motor 102 may be monitored by VFD 110 via feedback of, e.g., motor voltage and motor current. As the initial speed of AC motor 102 is sensed, VFD 110 may gradually and controllably increase both the output voltage peak magnitude and frequency. As the speed of AC motor 102 continues to increase, so too does the output voltage peak magnitude and frequency provided by VFD 110.

As the motor speed reaches the rated speed of AC motor 102, the voltage peak magnitude and frequency provided by VFD 110 may be at or near VFD 110's voltage rating (i.e., at or near the rated voltage of AC motor 102) and the frequency of utility power source 114 (which may be, e.g., 60 hertz). At about this point, power provided to AC motor 102 may be switched from VFD 110 to utility power source 114. VFD 110 may cause second contactor 130 to connect utility power (received from utility power source 114) to AC motor 102, while VFD 110 may cause first contactor 122 to disconnect the variable output voltage of VFD 110 (via reactor 118) from AC motor 102. That is, first, second, and third control switches 123, 124, and 125 of first contactor 122 may be opened by VFD 110, while first, second, and third control switches 131, 132, and 133 of second contactor 130 may be closed by VFD 110. In some cases, AC motor 102 may be momentarily coupled to both VFD 110 and utility power source 114. Reactor 118 may limit current exchanged between VFD 110 and utility power source 114 in this situation. To ensure that VFD 110 may be able to startup and drive AC motor 102 to its rated speed, VFD 110 may have a voltage rating that is the same or substantially the same as the rated voltage of AC motor 102. For example, if the rated voltage of AC motor 102 is 6.9 kV AC, the voltage rating of VFD 110 may be about 6.9 kV AC.

Figure 2:
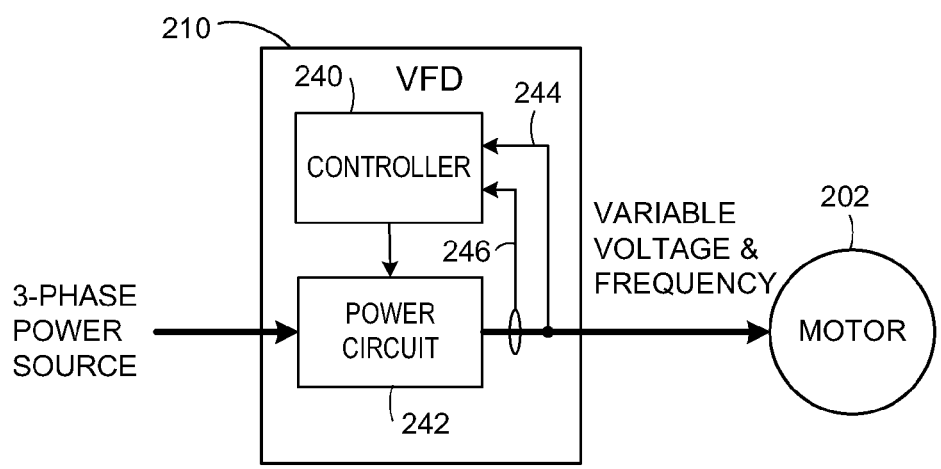
FIG. 2 illustrates a schematic diagram of a VFD according to the prior art.

In some embodiments, VFD 110 may have a configuration similar or identical to a VFD 210 of FIG. 2. VFD 210 may output a voltage having a magnitude and frequency that may vary. The frequency may vary, e.g., from 0 up to the frequency of the AC input line which, as shown, may be from a 3-phase power source and may be, e.g., 60 hertz. The voltage magnitude may vary, e.g., from 0 up to about the voltage rating of VFD 210. VFD 210 may include a controller 240 and a power circuit 242. Controller 240 may control the operation of power circuit 242 and may be coupled to motor voltage feedback line 244 and motor current feedback line 246. Voltage feedback line 244 and current feedback line 246 may be coupled to AC motor 202. Controller 240 may monitor voltage feedback line 244 and current feedback line 246 to determine the speed of AC motor 202 and consequently determine whether to adjust the output voltage magnitude and frequency in accordance with programming (e.g., a motor model) stored in and/or executing on controller 240. In some embodiments, controller 240 may include a microprocessor or other suitable CPU (central processing unit) and a memory for storing software routines to determine motor speed and the criteria for varying the output voltage magnitude and frequency. Alternatively, controller 240 may transmit feedback information to another component (not shown) and receive commands from that component regarding adjustments to the output voltage magnitude and frequency. In some embodiments, power circuit 242 may convert received AC line voltage to a DC voltage and then invert the DC voltage back to a pulsed DC voltage whose RMS (root mean square) value simulates an AC voltage. In some embodiments, power circuit 242 may include a rectifier, an inverter, and/or PWM (pulse width modulation) circuitry configured to vary the output voltage of VFD 210.

Figure 3:
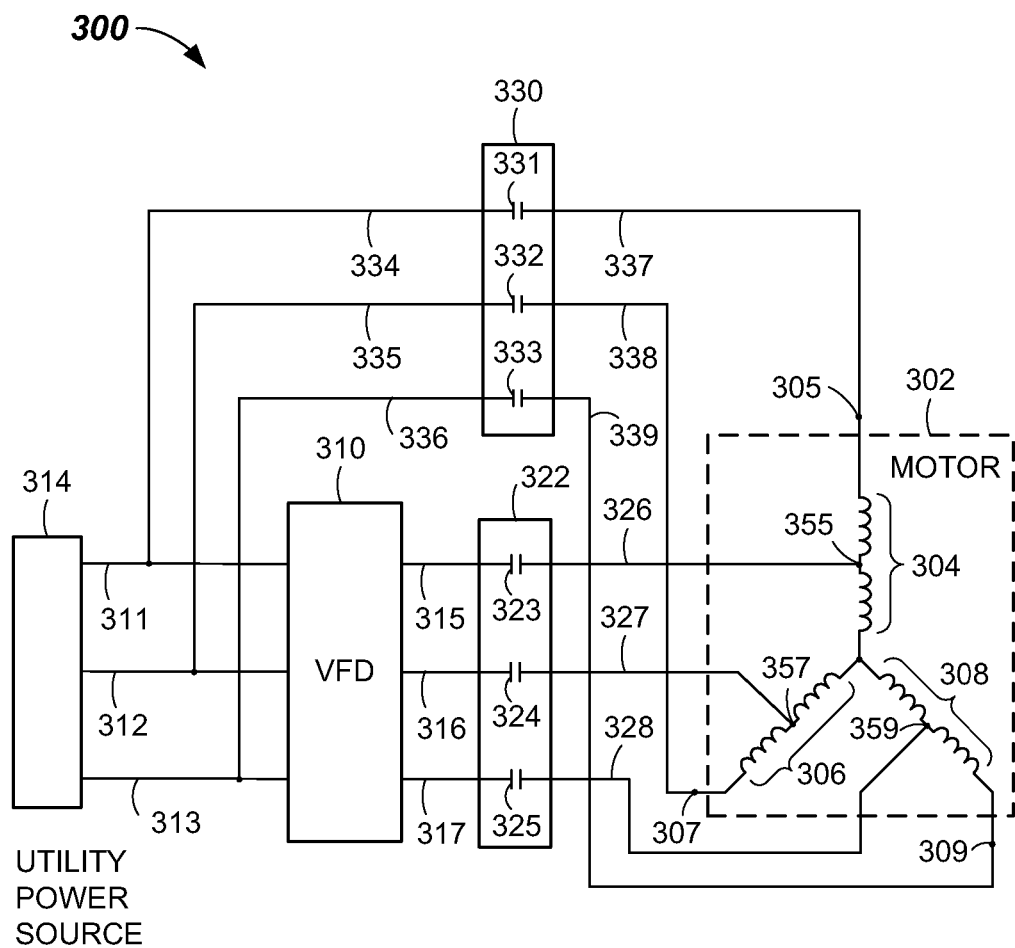
FIG. 3 illustrates a schematic diagram of a system for starting large AC motors with a VFD according to embodiments.

FIG. 3 illustrates a system 300 for starting a large AC motor 302 in accordance with one or more embodiments. AC motor 302 may be a 3-phase medium voltage AC motor having a rated voltage in a range of 600 volts AC to 15,000 volts AC. In some embodiments, AC motor 302 may be an induction (or asynchronous) AC motor or a synchronous AC motor. AC motor 302 may alternatively be another suitable type of AC motor that may benefit from soft starting. AC motor 302 may have a first winding 304, a second winding 306, and a third winding 308 arranged in a star or Y-connection configuration. First winding 304 may have a first lead winding connection 305. Second winding 306 may have a second lead winding connection 307, and third winding 308 may have a third lead winding connection 309. AC motor 302 may also have a first tapped winding connection 355 within first winding 304, a second tapped winding connection 357 within second winding 306, and a third tapped winding connection 359 within third winding 308. In some embodiment, the first, second, and third tapped winding connections 355, 357, and 359 are configured such that the tap voltages may be about 50% of the rated voltage of AC motor 302. In some embodiments, the first, second, and third tapped winding connections 355, 357, and 359 may be configured as voltage taps in a range of about 33% to about 67% of the rated voltage of AC motor 302. AC motor 302 may be coupled to a load (not shown), which may be, e.g., one or more compressors, pumps, fans, and/or other suitable equipment.

System 300 may also include a variable frequency drive (VFD) 310, which may be coupled to receive 3-phase power via conductors 311, 312, and 313 (one conductor per phase) from a utility power source 314. VFD 310 may be configured to output 3-phase power having a variable peak voltage magnitude and a variable frequency via conductors 315, 316, and 317 (one conductor per phase). The maximum peak magnitude of the output voltage provided by VFD 310 may be equal to about the voltage rating of VFD 310. VFD 310 may have a voltage rating that is much less than the rated voltage of AC motor 302. In some embodiments, the voltage rating of VFD 310 may be about 50% of the rated voltage of AC motor 302. For example, if AC motor 302 has a rated voltage of 13.8 kV AC and first, second, and third tapped winding connections 355, 357, and 359 are configured as about 50% voltage taps, a VFD 310 having a voltage rating of about 6.9 kV AC may be used. In some embodiments, the voltage rating of VFD 310 may be in a range of about 33% to about 67% of the rated voltage of AC motor 302 in accordance with similar or identical voltage tap configurations of tapped winding connections 355, 357, and 359 of AC motor 302. In some embodiments, VFD 310 may be configured or programmed with appropriate data (e.g., rated speed, desired startup time, etc.) pertaining to AC motor 302. In some embodiments, VFD 310 may be configured similarly or identically as VFD 210.

System 300 may further include a first contactor 322 and a second contactor 330. First contactor 322 may be coupled in series between VFD 310 and the first, second, and third tapped winding connections 355, 357, and 359 of AC motor 302. First contactor 322 may include a first control switch 323, a second control switch 324, and a third control switch 325 each coupled in series to VFD 310 via respective conductors 315, 316, and 317. Unlike system 100, system 300 may not need and, thus, may not include a reactor, such as reactor 118, coupled in series to the outputs of VFD 310, because the amount of AC current flowing into AC motor 302 during startup may not need to be reduced by a reactor. First control switch 323 may also be coupled in series to first tapped winding connection 355 via conductor 326. Second control switch 324 may also be coupled in series to second tapped winding connection 357 via conductor 327, and third control switch 325 may also be coupled in series to third tapped winding connection 359 via conductor 328.

Second contactor 330 may be coupled in series between utility power source 314 and the first, second, and third lead winding connections 305, 307, and 309 of AC motor 302. Second contactor 330 may include a first control switch 331, a second control switch 332, and a third control switch 333 each coupled in series to 3-phase utility power source 314 via respective conductors 334, 335, and 336 (one conductor per phase). First control switch 331 may also be coupled in series to first lead winding connection 305 via conductor 337. Second control switch 332 may also be coupled in series to second lead winding connection 307 via conductor 338, and third control switch 333 may be coupled in series to third lead winding connection 309 via conductor 339.

First contactor 322 and second contactor 330 may be controlled by VFD 310. That is, VFD 310 may control the opening and closing of first, second, and third control switches 323, 324, and 325 to connect and disconnect the output voltage of VFD 310 to and from AC motor 302. Similarly, VFD 310 may control the opening and closing of first, second, and third control switches 331, 332, and 333 to connect and disconnect utility power of utility power source 314 to and from AC motor 302. In some embodiments, contactors 322 and/or 330 may have more than one control switch per phase line and/or may be of other configurations suitable for connecting and disconnecting power between VFD 310 and AC motor 302 and between utility power source 314 and AC motor 302, respectively.

Each of conductors 311-313, 315-317, 326-328, 334-336, and 337-339 may be an electrical wire or cable of suitable gauge and/or size.

To start up AC motor 302, system 300 may operate as follows: Upon or prior to startup, VFD 310 may cause first contactor 322 to connect the variable voltage output of VFD 310 to AC motor 302, while VFD 310 may cause second contactor 330 to disconnect utility power (received from utility power source 314) from AC motor 302. That is, first, second, and third control switches 323, 324, and 325 of first contactor 322 may be closed by VFD 310, while first, second, and third control switches 331, 332, and 333 of second contactor 330 may be opened by VFD 310. VFD 310, which may receive 3-phase power from utility power source 314, may then initially provide a low or near-zero voltage having a low or near-zero frequency to each of first, second, and third tapped winding connections 355, 357, and 359 (separated by appropriate phase angles) via respective conductors 326, 327, and 328. In some embodiments, the load (not shown) of AC motor 302 may be reduced temporarily during startup. The application of voltage to AC motor 302 may cause the rotor (not shown) of AC motor 302 to begin rotating (in other words, the speed of AC motor 302 begins to increase from zero). The speed of AC motor 302 is monitored by VFD 310 via feedback of, e.g., motor voltage and motor current. As the initial speed of AC motor 302 is sensed, VFD 310 may gradually and controllably increase both the output voltage peak magnitude and frequency. As the speed of AC motor 302 continues to increase, so too does the output voltage peak magnitude and frequency provided by VFD 310.

As the motor speed reaches the rated speed of AC motor 302, the frequency provided by VFD 310 may be at or near the frequency of utility power source 314 (which may be, e.g., at or about 60 hertz) and the voltage peak magnitude provided by VFD 310 may be at or about VFD's voltage rating, which may be the percent of the rated voltage of AC motor 302 determined in accordance with the tapped winding connections 355, 357, and 359, as described above. At about this point, power provided to AC motor 302 may be switched from VFD 310 (applied to first, second, and third tapped winding connections 355, 357, and 359) to utility power source 314 (applied to first, second, and third lead winding connections 305, 307, and 309). VFD 310 may cause second contactor 330 to connect utility power (received from utility power source 314) to AC motor 302, while VFD 310 may cause first contactor 322 to disconnect the variable voltage output of VFD 310 (via reactor 318) from AC motor 302. That is, first, second, and third control switches 323, 324, and 325 of first contactor 322 may be opened by VFD 310, while first, second, and third control switches 331, 332, and 333 of second contactor 330 may be closed by VFD 310. In some cases, AC motor 302 may be momentarily coupled to both VFD 310 and utility power source 314.

A VFD 310 suitable for soft starting AC motor 302 having a rated voltage of 13.8 kV AC with first, second, and third tapped winding connections 355, 357, and 359 configured as about 50% voltage taps may be, e.g., a Perfect Harmony drive, 6.9 kV output as manufactured by Siemens LD, New Kensington, Pa., USA.

Figure 4:
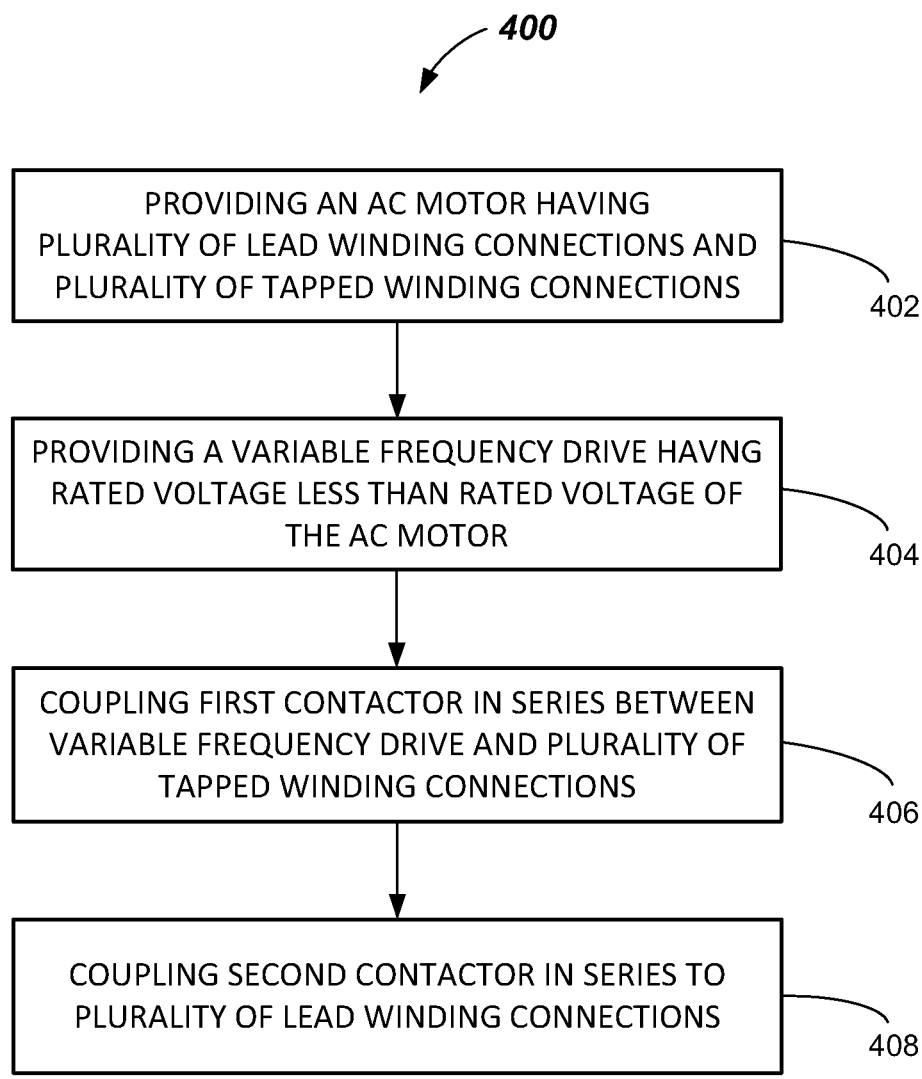
FIG. 4 illustrates a flowchart of a method of starting a large AC motor with a VFD according to embodiments.

FIG. 4 illustrates a method 400 of starting an AC motor in accordance with one or more embodiments. At process block 402, method 400 may include providing an AC motor having a rated voltage, a plurality of lead winding connections, and a plurality of tapped winding connections, the plurality of lead winding connections configured to receive power from a utility power source. In some embodiments, the AC motor may be a 3-phase medium voltage motor such as, e.g., AC motor 302 of FIG. 3, and the plurality of lead winding connections may be, e.g., first, second, and third lead winding connections 305, 307, and 309, respectively. The plurality of tapped winding connections may be, e.g., first, second, and third tapped winding connections 355, 357, and 359, respectively. The tapped winding connections may be configured as 50% voltage taps and/or may be configured as voltage taps in a range of about 33% to about 67% of the rated voltage of the AC motor. The AC motor may alternatively be any suitable type of AC motor having a plurality of lead winding connections and a plurality of tapped winding connections as described herein.

At process block 404, method 400 may include providing a variable frequency drive (VFD) having a voltage rating less than the rated voltage of the AC motor. For example, the VFD may be, e.g., VFD 310 of FIG. 3, and may have in some embodiments a voltage rating that is about 50% of the rated voltage of the AC motor. In some embodiments, the VFD may have a voltage rating in a range of 33% to 67% of the rated voltage of the AC motor. In some embodiments, the VFD may be configured similarly or identically as, e.g., VFD 210 of FIG. 2.

At process block 406, coupling a first contactor in series between the VFD and the plurality of tapped winding connections may be performed. The first contactor may be controlled by the VFD to selectively connect and disconnect an output voltage of the VFD to and from the plurality of tapped winding connections. For example, the first contactor may be first contactor 322 of FIG. 3, which may be controlled by VFD 310. In some embodiments, the first contactor may have a plurality of control switches, one switch per power phase, such as, e.g., first, second, and third control switches 323, 324, and 325 of first contactor 322, wherein the VFD may control the opening and closing of the plurality of control switches to selectively connect and disconnect the output voltage of the VFD to and from the plurality of tapped winding connections At process block 408, method 400 may include coupling a second contactor in series to the plurality of lead winding connections. The second contactor may be controlled by the VFD to selectively connect and disconnect utility power (from a utility power source) to and from the plurality of lead winding connections. For example, the second contactor may be second contactor 330 of FIG. 3, which may be controlled by VFD 310. In some embodiments, the second contactor may have a plurality of control switches, one switch per power phase, such as, e.g., first, second, and third control switches 331, 332, and 333, wherein the VFD may control the opening and closing of plurality of control switches to selectively connect and disconnect utility power to and from the plurality of lead winding connections.

The above process blocks of method 400 may be executed or performed in an order or sequence not limited to the order and sequence shown and described. For example, in some embodiments, process block 402 may be performed after or in parallel with process block 404. Similarly, process block 406 may be performed after or in parallel with process block 408.

Persons skilled in the art should readily appreciate that the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described in connection with medium voltage 3-phase AC motors, one or more embodiments of the invention may be used with other types of AC motors where soft starting of the AC motor is desired. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems or methods disclosed, but, to the contrary, the intention is to cover all modifications, equivalents, and alternatives falling within the scope of the invention.

What is claimed is:

1. A system for starting an alternating current (AC) motor, comprising:
    a variable frequency drive configured to be coupled to a utility power source and to provide an output voltage having a variable frequency and a variable peak magnitude, wherein the utility power source provides 3-phase power;
    an AC motor having a rated voltage, a plurality of lead winding connections, and a plurality of tapped winding connections, wherein the plurality of tapped winding connections include a first tapped winding connection within a first winding of the AC motor, a second tapped winding connection within a second winding of the AC motor, and a third tapped winding connection within a third winding of the AC motor, wherein the first, second, and third windings are in a star or Y-connection configuration;
    a first contactor coupled in series between the variable frequency drive and the plurality of tapped winding connections, the first contactor controlled by the variable frequency drive to selectively connect and disconnect the output voltage to and from the plurality of tapped winding connections; and
    a second contactor coupled in series to the plurality of lead winding connections, the second contactor controlled by the variable frequency drive to selectively connect and disconnect power received from the utility power source to and from the plurality of lead winding connections,
    wherein the output voltage has a maximum peak magnitude in a range of about 33% to about 67% of the rated voltage of the AC motor,
    wherein while the second contactor has disconnected utility power from the plurality of lead winding connections, the variable frequency drive is configured to cause the first contactor to connect the output voltage of the variable frequency drive to the plurality of tapped winding connections, which causes the AC motor to increase in speed,
    wherein after the output voltage and frequency of power provided to the AC motor from the variable frequency drive has caused an increase in speed of the AC motor, the variable frequency drive is configured to cause the first contactor to disconnect the output voltage of the variable frequency drive from the plurality of tapped windings and cause the second contactor to connect utility power received from the utility power source to the plurality of lead winding connections.

2. The system of claim 1, wherein the utility power source provides 3-phase power and the plurality of lead winding connections include a first lead winding connection at a first winding of the AC motor, a second lead winding connection at a second winding of the AC motor, and a third lead winding connection at a third winding of the AC motor, wherein the first, second, and third windings are in a star or Y-connection configuration.

3. The system of claim 1 wherein the variable frequency drive comprises:
    a power circuit configured to provide the output voltage; and
    a controller coupled to the power circuit and configured to adjust the variable peak magnitude and the variable frequency of the output voltage based on feedback received from the AC motor.

4. The system of claim 3, wherein the feedback comprises motor current, motor voltage, or both.

5. The system of claim 1, wherein the first and second contactors each comprise at least one control switch.

6. The system of claim 1, wherein the variable frequency drive has a voltage rating in a range of about 33% to about 67% of the rated voltage of the AC motor.

7. The system of claim 1 wherein the AC motor has a rated voltage in a range of about 600 volts to about 15,000 volts.

8. An alternating current (AC) motor system comprising:
    an AC motor including:
    a plurality of lead winding connections configured to receive a rated voltage of the AC motor from a utility power source;
    a plurality of tapped winding connections configured to receive a maximum voltage less than the rated voltage, wherein the number of tapped winding connections equals the number of lead winding connections, wherein the plurality of tapped winding connections comprises a respective plurality of voltage taps in a range of about 33% to about 67% of the rated voltage;
    wherein the plurality of lead winding connections comprises three voltage phase connections coupled to respective leads of first, second, and third windings of the AC motor;
    wherein the plurality of tapped winding connections comprises a first tapped winding connection within the first winding, a second tapped winding connection within the second winding, and a third tapped winding connection within the third winding; and
    wherein the first, second, and third windings are in a star or Y-connection configuration, and
    a variable frequency drive configured to be coupled to a utility power source and to provide an output voltage having a variable frequency and a variable peak magnitude, the output voltage having a maximum peak magnitude in a range of about 33% to about 67% of the rated voltage of the AC motor, wherein the variable frequency drive is configured to selectively cause the utility power source to be connected to and disconnected from the plurality of lead winding connections, wherein the variable frequency drive is configured to selectively cause the voltage output of the variable frequency drive to be connected to and disconnected from the plurality of tap windings connections, wherein while the utility power source is disconnected from the plurality of lead winding connections, the variable frequency drive is configured to cause the output voltage of the variable frequency drive to be connected to the plurality of tapped winding connections, which causes the AC motor to increase in speed, wherein after the output voltage and frequency of power provided to the AC motor from the variable frequency drive has caused an increase in speed of the AC motor, the variable frequency drive is configured to cause the output voltage of the variable frequency drive to be disconnected from the plurality of tapped windings and is configured to cause the utility power source to be connected to the plurality of lead winding connections.

9. The system of claim 8 further comprising:
a first contactor coupled in series between the variable frequency drive and the plurality of tapped winding connections; and
a second contactor coupled in series between the utility power source and the plurality of lead winding connections,
wherein the first contactor and the second contactor are controlled by the variable frequency drive.

10. A method of starting an alternating current (AC) motor, comprising:
providing:
an AC motor having a rated voltage, a plurality of lead winding connections, and a plurality of tapped winding connections,
wherein the plurality of tapped winding connections includes a first tapped winding connection within a first winding of the AC motor, a second tapped winding connection within a second winding of the AC motor, and a third tapped winding connection within a third winding of the AC motor,
wherein the first, second, and third windings are in a star or Y-connection configuration;
a variable frequency drive having a voltage rating less than the rated voltage of the AC motor, wherein the variable frequency drive is connected to a utility power source;
a first contactor coupled in series between the variable frequency drive and the plurality of tapped winding connections, the first contactor controlled by the variable frequency drive to selectively connect and disconnect an output voltage of the variable frequency drive to and from the plurality of tapped winding connections; and
a second contactor coupled in series between the utility power source and the plurality of lead winding connections, the second contactor controlled by the variable frequency drive to selectively connect and disconnect utility power received from the utility power source to and from the plurality of lead winding connections,
wherein the variable frequency drive has a voltage rating in a range of about 33% to about 67% of the rated voltage of the AC motor, and
starting the AC motor including:
while the second contactor has disconnected utility power from the plurality of lead winding connections, the variable frequency drive causing the first contactor to connect the output voltage of the variable frequency drive to the plurality of tapped winding connections, which causes the AC motor to increase in speed;
after the output voltage and frequency of power provided to the AC motor from the variable frequency drive has caused an increase in speed of the AC motor, the variable frequency drive causing the first contactor to disconnect the output voltage of the variable frequency drive from the plurality of tapped windings and causing the second contactor to connect utility power received from the utility power source to the plurality of lead winding connections, wherein the utility power source provides 3-phase power.

11. The method of claim 10 further comprising at or prior to startup of the AC motor:
connecting at the first contactor the output voltage of the variable frequency drive to the plurality of tapped winding connections; and
disconnecting at the second contactor the utility power of the utility power source from the plurality of lead winding connections.

12. The method of claim 11 wherein the connecting comprises closing at least one control switch of the first contactor, and the disconnecting comprises opening at least one control switch of the second contactor at or prior to startup of the AC motor.

13. The method of claim 10 further comprising upon operation of the AC motor at a rated speed of the AC motor:
disconnecting at the first contactor the output voltage of the variable frequency drive from the plurality of tapped winding connections; and
connecting at the second contactor the utility power to the plurality of lead winding connections.

14. The system of claim 5, wherein the first contactor comprises a first control switch, a second control switch, and a third control switch each coupled in series to the variable frequency drive via respective conductors.

15. The system of claim 5, wherein the second contactor comprises a first control switch, a second control switch, and a third control switch each coupled in series to the 3-phase utility power source via respective conductors.

16. The AC motor of claim 8, the AC motor being a 3-phase medium voltage AC motor having a rated voltage in a range of 600 volts AC to 15,000 volts AC.

* * * * *